United States Patent
Chun et al.

(10) Patent No.: US 10,757,331 B2
(45) Date of Patent: Aug. 25, 2020

(54) CAMERA POSTURE ESTIMATION METHOD AND SUBSTRATE PROCESSING APPARATUS

(71) Applicant: SEMES CO., LTD., Chungcheongnam-do (KR)

(72) Inventors: Sungyong Chun, Cheonan-si (KR); Ohyeol Kwon, Cheonan-si (KR); Sung Wook Bae, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/437,016

(22) Filed: Jun. 11, 2019

(65) Prior Publication Data
US 2019/0379833 A1 Dec. 12, 2019

(30) Foreign Application Priority Data
Jun. 11, 2018 (KR) .......................... 10-2018-0066691

(51) Int. Cl.
*H04N 5/232* (2006.01)
*H04N 5/225* (2006.01)
*H01L 21/67* (2006.01)

(52) U.S. Cl.
CPC ... *H04N 5/23248* (2013.01); *H01L 21/67259* (2013.01); *H04N 5/2257* (2013.01)

(58) Field of Classification Search
None
See application file for complete search history.

(56) References Cited

U.S. PATENT DOCUMENTS

| | | | |
|---|---|---|---|
| 6,473,161 B1* | 10/2002 | Cuijpers | F16F 15/0275 355/53 |
| 7,696,653 B2* | 4/2010 | Tanaka | G03F 7/70716 310/12.01 |
| 2005/0151841 A1* | 7/2005 | Nelson | G01N 21/8851 348/82 |
| 2005/0211885 A1* | 9/2005 | Tobiason | G01D 5/268 250/231.13 |
| 2013/0027554 A1* | 1/2013 | Meadow | 348/144 |

(Continued)

FOREIGN PATENT DOCUMENTS

| | | |
|---|---|---|
| JP | 2013-036804 A | 2/2013 |
| KR | 10-0203329 B | 3/1999 |
| KR | 10-0784622 B | 12/2007 |

(Continued)

*Primary Examiner* — Chikaodili E Anyikire
(74) *Attorney, Agent, or Firm* — Li & Cai Intellectual Property (USA) Office

(57) ABSTRACT

A method for estimating a posture of a camera installed in a substrate processing apparatus to obliquely photograph an object includes removing the remaining background other than a substrate and performing ellipse fitting, adjusting a yaw direction of the camera by using a difference between the center of a camera image and the center of an elliptical substrate image obtained by performing the ellipse fitting, adjusting a roll direction of the camera by using a tilt angle of an ellipse in the elliptical substrate image obtained by performing the ellipse fitting, and adjusting a pitch direction of the camera by using a ratio of a minor axis to a major axis of the ellipse in the elliptical substrate image obtained by performing the ellipse fitting.

12 Claims, 9 Drawing Sheets

(56) References Cited

U.S. PATENT DOCUMENTS

2018/0348145 A1* 12/2018 Witte ..................... G01J 1/42

FOREIGN PATENT DOCUMENTS

| KR | 10-2009-0114565 A | 11/2009 |
|----|-------------------|---------|
| KR | 10-1195942 B | 10/2012 |
| KR | 10-1404516 B | 5/2014 |
| KR | 10-1547108 B | 8/2015 |
| KR | 10-2016-0035212 A | 3/2016 |
| KR | 10-2016-0052198 A | 5/2016 |
| KR | 10-1747852 B | 6/2017 |
| KR | 10-1755687 B | 7/2017 |
| KR | 10-1791590 B | 10/2017 |

* cited by examiner

FIG. 5
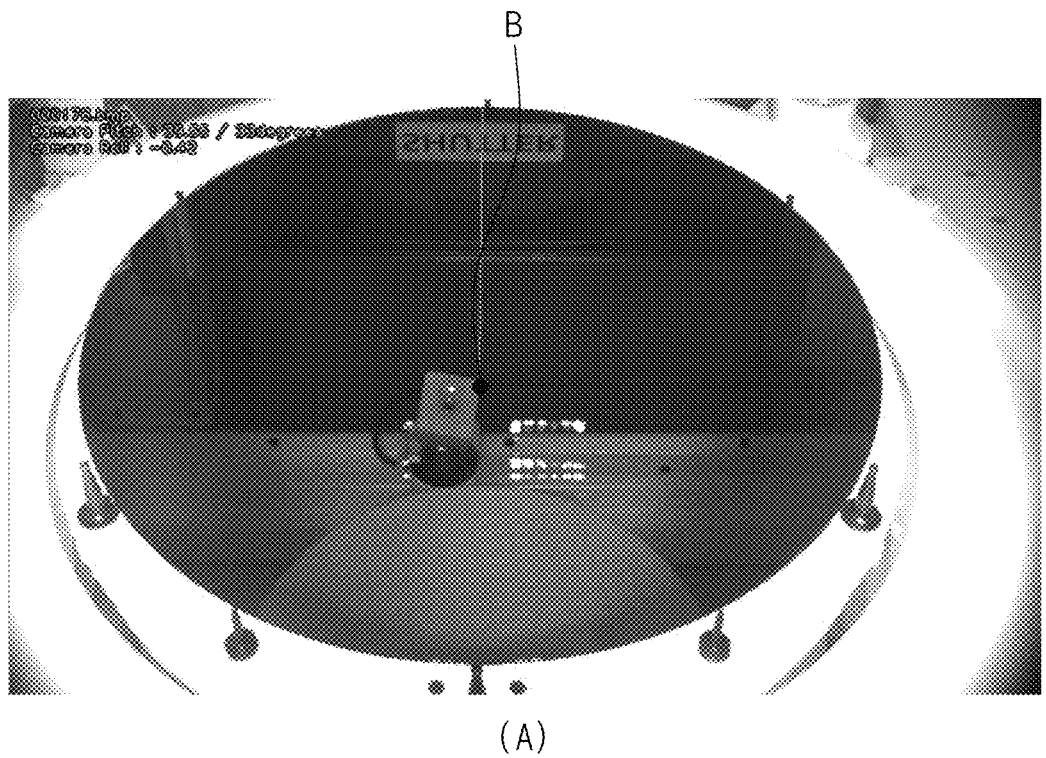
(A)
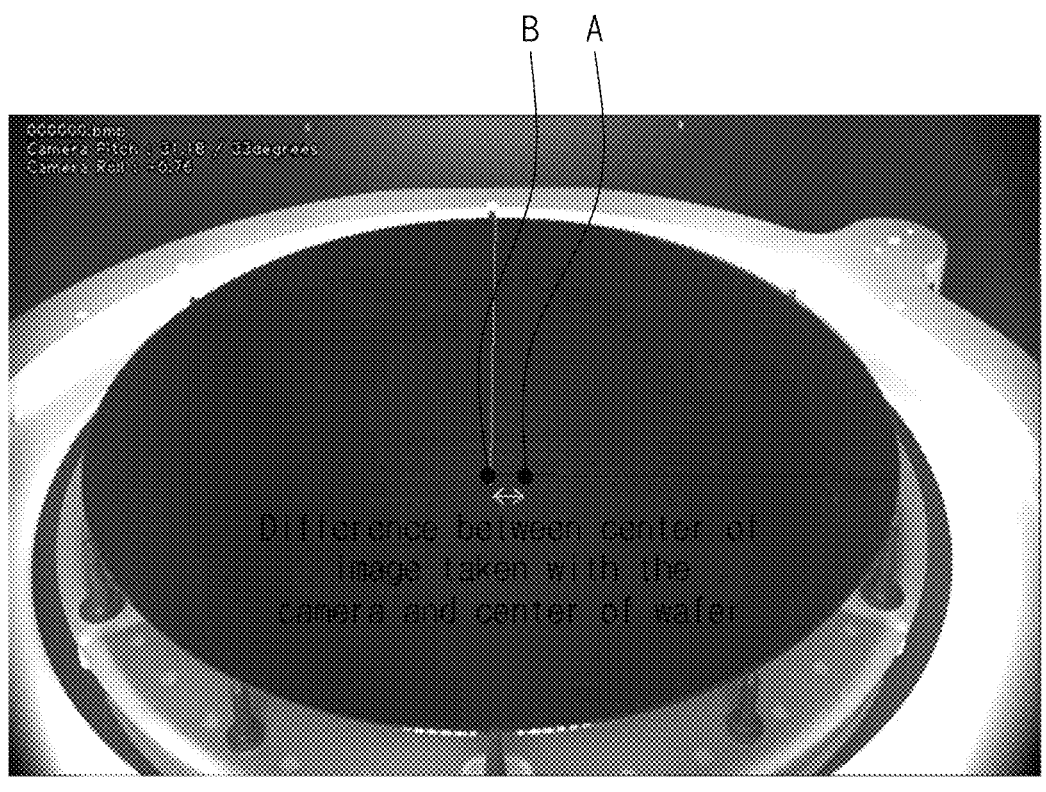
(B)

FIG. 7
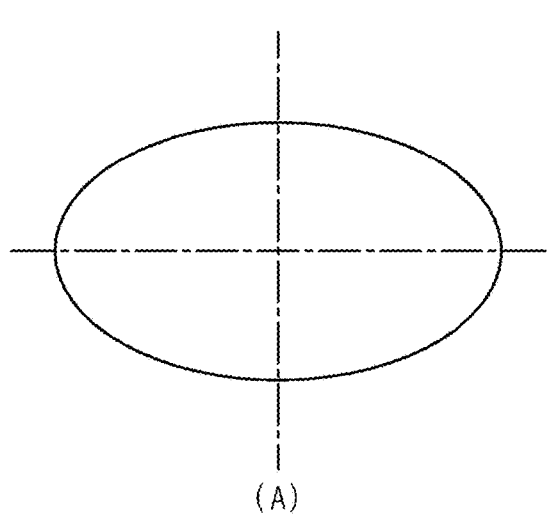
(A)
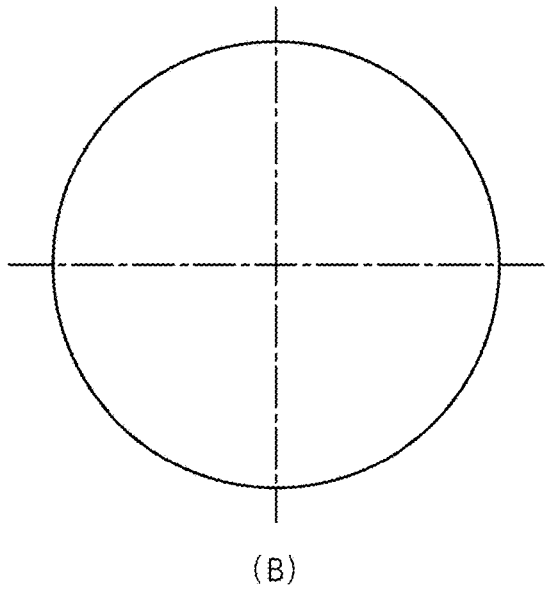
(B)
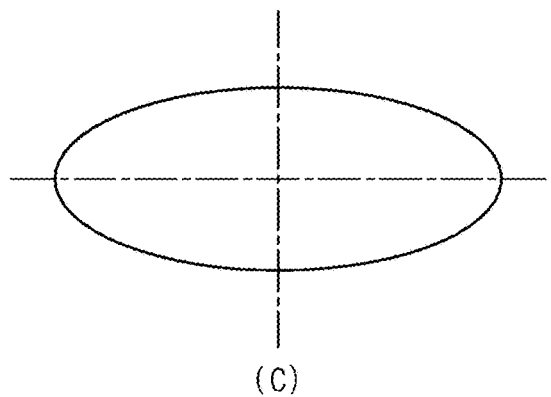
(C)
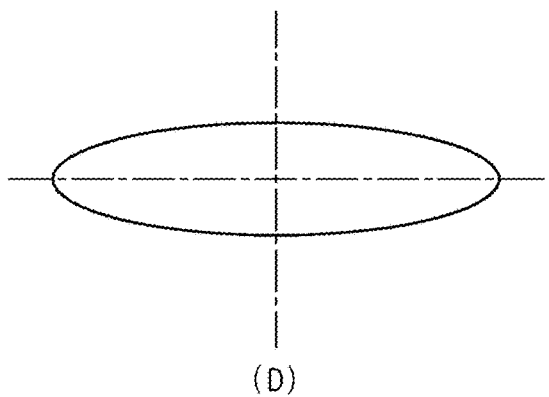
(D)

CAMERA POSTURE ESTIMATION METHOD AND SUBSTRATE PROCESSING APPARATUS

CROSS-REFERENCE TO RELATED APPLICATIONS

A claim for priority under 35 U.S.C. § 119 is made to Korean Patent Application No. 10-2018-0066691 filed on Jun. 11, 2018, in the Korean Intellectual Property Office, the entire contents of which are hereby incorporated by reference.

BACKGROUND

Embodiments of the inventive concept described herein relate to a camera posture estimation method and a substrate processing apparatus.

A camera aiming for inspection that is mounted in a semiconductor facility has to be accurately installed in a specified position for accurate inspection. When this is not satisfied, a failure in inspection or a malfunction may be caused, and problems in a part tolerance and an assembly tolerance may arise due to the nature of a mass-production facility. To make this uniform, the position where each camera is installed has to be accurately adjusted. To accurately adjust the position of the camera, a special jig such as a substrate having a special pattern as illustrated in FIG. 1 is required, the position of the camera is estimated by using a three-dimensional measurement camera, the position of the camera is estimated by using a feature point in a learned image, or an external sensor using a tilt or gravity sensor is used.

However, in the case of using the special jig such as the substrate having the special pattern as illustrated in FIG. 1, it is troublesome to have the corresponding jig for adjustment of the camera. In the case of using the three-dimensional measurement camera, there is a problem in cost, and in the case where the three-dimensional measurement camera is not required for inspection that is the original objective, it may be a waste to mount the camera to estimate the posture. Furthermore, in the case of the camera position estimation using the feature point in the learned image, it is not suitable for precise adjustment because the estimation is performed based on the learned information. Moreover, the methods using the external sensor using the tilt or gravity sensor also have problems in terms of additional cost and separate installation space.

SUMMARY

Embodiments of the inventive concept provide a substrate processing apparatus including a camera for singly estimating a position without depending on a special jig, an external sensor, or learning data.

Embodiments of the inventive concept provide a substrate processing apparatus for estimating a posture in real time by using a camera that photographs a substrate at present.

Embodiments of the inventive concept provide a method for easily and accurately estimating the posture of a camera.

The technical problems to be solved by the inventive concept are not limited to the aforementioned problems. Any other technical problems not mentioned herein will be clearly understood from the following description by those skilled in the art to which the inventive concept pertains.

According to an exemplary embodiment, a method for estimating a posture of a camera installed in a substrate processing apparatus to obliquely photograph an object is disclosed.

The camera posture estimation method includes removing the remaining background other than a substrate and performing ellipse fitting.

In addition, the camera posture estimation method further includes adjusting a yaw direction of the camera by using a difference between the center of a camera image and the center of an elliptical substrate image obtained by performing the ellipse fitting, adjusting a roll direction of the camera by using a tilt angle of an ellipse in the elliptical substrate image obtained by performing the ellipse fitting, and adjusting a pitch direction of the camera by using a ratio of a minor axis to a major axis of the ellipse in the elliptical substrate image obtained by performing the ellipse fitting.

The adjusting of the yaw direction of the camera may include identifying the center of the elliptical substrate image obtained by performing the ellipse fitting, calculating a distance difference between the center of the elliptical substrate image and a central pixel position of the camera image, and adjusting the yaw direction by the distance difference.

In another embodiment of the inventive concept, the adjusting of the yaw direction of the camera may include detecting a back nozzle installed in the center of a support unit that supports the substrate, before performing the ellipse fitting, calculating a distance difference between a central pixel position of an image of the detected back nozzle and a central pixel position of the camera image, and adjusting the yaw direction by the distance difference.

The adjusting of the roll direction of the camera may include estimating a tilt angle of the elliptical substrate image obtained by performing the ellipse fitting and adjusting the roll direction by the tilt angle.

The adjusting of the pitch direction of the camera may include measuring lengths of a major axis and a minor axis of the elliptical substrate image obtained by performing the ellipse fitting, calculating a pitch angle by using the measured lengths of the major and minor axes, and adjusting the pitch direction by a difference between a reference design angle and the calculated pitch angle.

In the camera posture estimation method, the adjusting of the roll direction, the pitch direction, or the yaw direction of the camera may be independently performed.

According to an exemplary embodiment, an apparatus for processing a substrate includes a process chamber having a processing space inside, a support unit that supports the substrate in the process chamber, a gas supply unit that supplies a process gas into the processing space, and a plasma source that generates plasma from the process gas.

The substrate processing apparatus further includes a camera installed in the apparatus to obliquely photograph the substrate and a controller that adjusts a posture of the camera in a yaw, roll, or pitch direction by using the substrate supported on the support unit.

The controller may include a fitting unit that removes the remaining background other than the substrate photographed and performs ellipse fitting.

The controller may include a first controller that adjusts the yaw direction of the camera, and the first controller may identify the center of an elliptical substrate image obtained by performing the ellipse fitting by the fitting unit, may calculate a distance difference between the center of the elliptical substrate image and a central pixel position of an image taken with the camera, and may adjust the yaw direction by the distance difference.

In another embodiment of the inventive concept, the controller may include a first controller that adjusts the yaw direction of the camera, and the first controller may detect a back nozzle installed in the center of the support unit that supports the substrate, may calculate a distance difference between a central pixel position of an image of the detected back nozzle and a central pixel position of an image taken with the camera, and may adjust the yaw direction by the distance difference.

The controller may include a second controller that adjusts the roll direction of the camera, and the second controller may estimate a tilt angle of an elliptical substrate image obtained by performing the ellipse fitting by the fitting unit and may adjust the roll direction by the tilt angle.

The controller may include a third controller that adjusts the pitch direction of the camera, and the third controller may measure lengths of a major axis and a minor axis of an elliptical substrate image obtained by performing the ellipse fitting by the fitting unit, may calculate a pitch angle by using the measured lengths of the major and minor axes, and may adjust the pitch direction by a difference between a reference design angle and the calculated pitch angle.

The controller may independently adjust the roll direction, the pitch direction, or the yaw direction of the camera.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a view illustrating adjustment of a yaw direction of a camera in the inventive concept;

FIG. 7 is a view illustrating adjustment of a pitch direction of a camera in the inventive concept;

DETAILED DESCRIPTION

Figure 1:
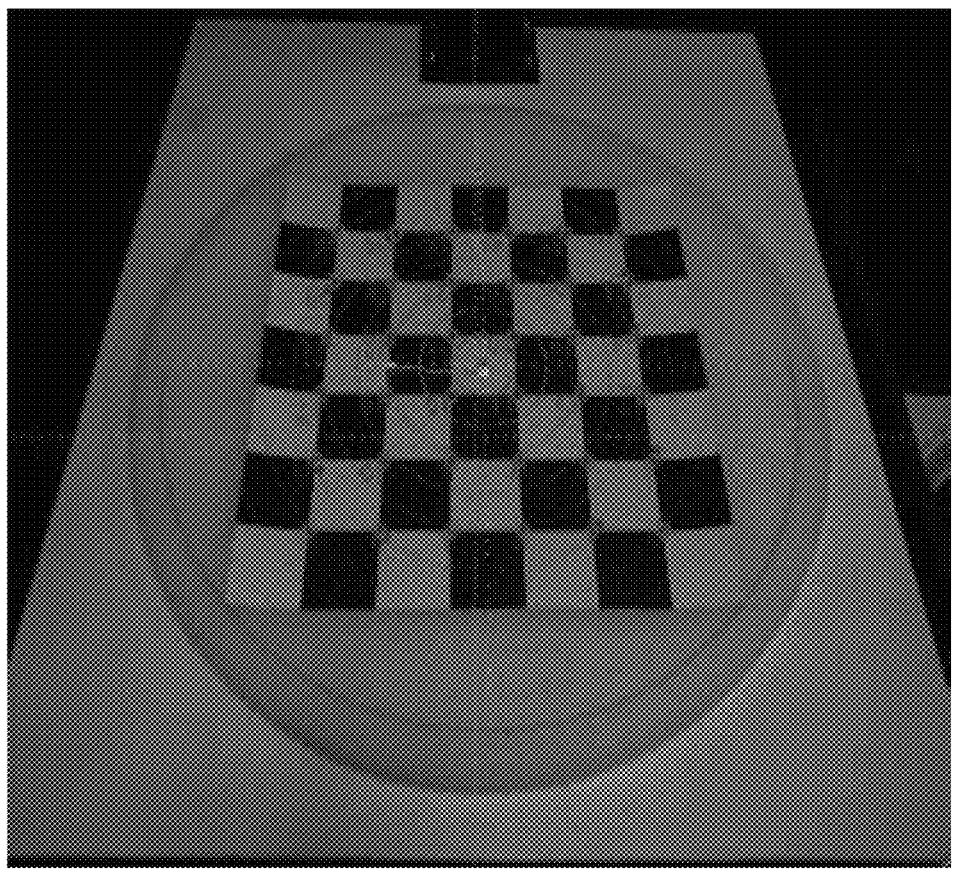
FIG. 1 is a view illustrating the use of a patterned substrate in the related art.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

In the entire specification, the terminology, component "unit," refers to a software component or a hardware component such as an FPGA or an ASIC, and performs at least one function or operation. It should be, however, understood that the component "unit" is not limited to a software or hardware component. The component "unit" may be implemented in storage media that can be designated by addresses. The component "unit" may also be configured to regenerate one or more processors.

For example, the component "unit" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "unit" may be separately performed by a plurality of components and components "units" and may also be integrated with other additional components.

Figure 2:
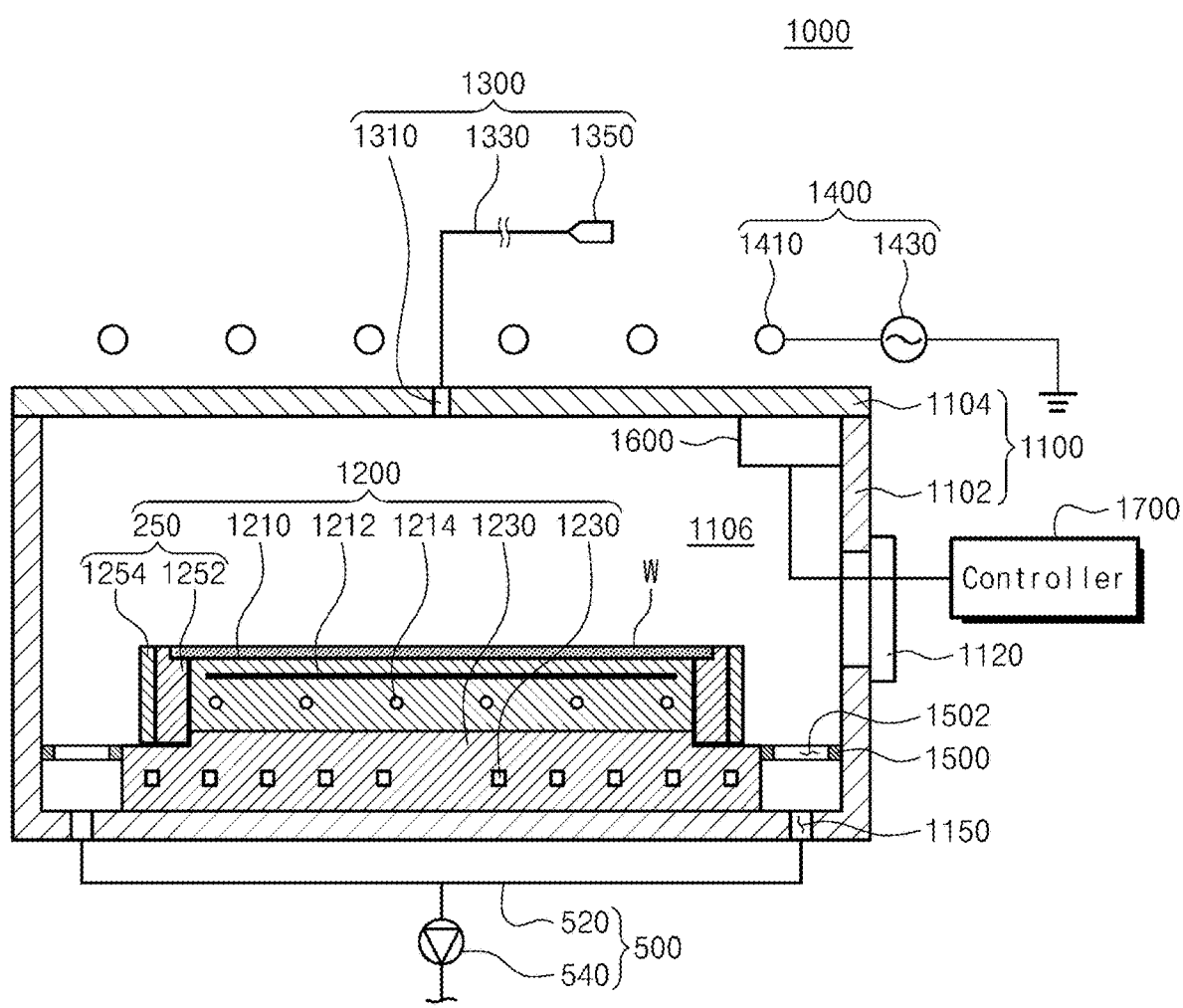
FIG. 2 is a sectional view illustrating a substrate processing apparatus according to the inventive concept.

FIG. 2 is a view illustrating a substrate processing apparatus according to the inventive concept.

Referring to FIG. 2, the substrate processing apparatus 1000 includes a chamber 1100, a substrate support unit 1200, a gas supply unit 1300, a plasma source 1400, an exhaust baffle 1500, a camera 1600, and a controller 1700.

The chamber 1100 has a processing space 1106 in which a substrate W is processed. The chamber 1100 is provided in a cylindrical shape. The chamber 1100 is made of metal. For example, the chamber 1100 may be made of aluminum. An opening is formed in one sidewall of the chamber 1100. The opening may function as an entrance through which the substrate W is placed in or extracted from the chamber 1100. The opening is closed or opened by a door 1120. A lower hole 1150 is formed in the bottom of the chamber 1100. A pressure-reducing member (not illustrated) is connected to the lower hole 1150. The processing space 1106 of the chamber 1100 may be exhausted by the pressure-reducing member, and a pressure-reduced atmosphere may be formed in the processing space 1106.

The substrate support unit 1200 supports the substrate W in the processing space 1106. The substrate support unit 1200 may be provided as an electrostatic chuck 1200 that supports the substrate W using an electrostatic force. Alternatively, the substrate support unit 1200 may support the substrate W by various methods such as mechanical clamping.

The electrostatic chuck 1200 includes a dielectric plate 1210, a base 1230, and an edge ring 1250. The dielectric plate 1210 is provided as a dielectric plate 1210 including a dielectric substance. The substrate W is directly placed on an upper surface of the dielectric plate 1210. The dielectric plate 1210 is provided in a circular plate shape. The dielectric plate 1210 may have a smaller radius than the substrate W. An inner electrode 1212 is installed inside the dielectric plate 1210. A power supply (not illustrated) is connected to the inner electrode 1212, and electric power is applied from the power supply (not illustrated) to the inner electrode 1212. The inner electrode 1212 provides an electrostatic force from the applied power (not illustrated) such that the substrate W is clamped to the dielectric plate 1210. A heater 1214 for heating the substrate W is installed inside the dielectric plate 1210. The heater 1214 may be located below the inner electrode 1212. The heater 1214 may be provided as a spiral coil shape.

The base 1230 supports the dielectric plate 1210. The base 1230 is located below the dielectric plate 1210 and is fixedly coupled to the dielectric plate 1210. An upper surface of the base 1230 has a stepped shape such that the central region is higher than the edge region. The central region of the upper surface of the base 1230 has an area corresponding to the bottom of the dielectric plate 1210. A cooling line 1232 is formed inside the base 1230. The cooling line 232 is provided as a passage through which a cooling fluid circulates. The cooling line 1232 may be provided in a spiral shape in the base 1230. The base 1230 is connected to an RF power supply 1234 located outside. The RF power supply 1234 applies electric power to the base 1230. The electric power applied to the base 1230 guides plasma generated in the chamber 1100 toward the base 1230. The base 1230 may be made of metal.

The edge ring 1250 concentrates the plasma onto the substrate W. The edge ring 1250 includes an inner ring 1252 and an outer ring 1254. The inner ring 1252 is provided in an annular ring shape surrounding the dielectric plate 1210. The inner ring 1252 is located on an edge region of the base 1230. A portion of the inner ring 1252 is provided to have the same height as the upper surface of the dielectric plate 1210. An inner portion of an upper surface of the inner ring 1252 supports an edge region of the bottom of the substrate W. The outer ring 1254 is provided in an annular ring shape surrounding the inner ring 1252. The outer ring 1254 is located adjacent to the inner ring 1252 on the edge region of the base 1230. The outer ring 1254 may have an upper end higher than the inner portion of the inner ring 1252.

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall of the chamber 1100. The gas intake port 1310 is located opposite the substrate support unit 1200. According to an embodiment, the gas intake port 1310 may be installed in the center of the upper wall of the chamber 1100. A valve may be installed in the gas supply line 1330 to open or close the inner passage or to adjust the flow rate of gas that flows through the inner passage. For example, the process gas may be an etching gas.

The plasma source 1400 excites the process gas in the chamber 1100 into a plasma state. An inductively coupled plasma (ICP) source may be used as the plasma source 1400. The plasma source 1400 includes an antenna 1410 and an external power supply 1430. The antenna 1410 is disposed on the exterior upper side of the chamber 1100. The antenna 1410 is provided in a spiral shape wound a plurality of times and is connected with the external power supply 1430. The antenna 1410 receives electric power from the external power supply 1430. The antenna 1410 to which the electric power is applied forms a discharge space in the inner space of the chamber 1100. The process gas staying in the discharge space may be excited into a plasma state.

The exhaust baffle 1500 uniformly releases the plasma from the processing space 1106 by region. The exhaust baffle 1500 has an annular ring shape. The exhaust baffle 1500 is located between an inner wall of the chamber 1100 and the substrate support unit 1200 in the processing space 1106. A plurality of exhaust holes 1502 are formed in the exhaust baffle 1500. The exhaust holes 1502 are provided to face the vertical direction. The exhaust holes 1502 are provided as holes extending from an upper end to a lower end of the exhaust baffle 1500. The exhaust holes 1502 are arranged to be spaced apart from each other along the circumferential direction of the exhaust baffle 1500. Each of the exhaust holes 1502 has a slit shape and has a longitudinal direction that faces the radial direction.

Hereinafter, the camera 1600 and the controller 1700 that the substrate processing apparatus 1000 includes will be described in detail.

The substrate processing apparatus 1000 may include the camera 1600 that photographs the substrate W. The camera 1600 performs the photographing in a position where the substrate W is entirely viewable. The camera 1600 may be located in a corner of the chamber 1100 where the substrate W is entirely viewable. A lens and a support for fixing the camera 1600 may be included in the camera 1600. The camera 1600 may photograph the substrate W in real time. The camera 1600 may be manufactured to be fixed to each substrate processing facility, and the installation position may be fixed.

The substrate processing apparatus 1000 may include the controller 1700. The controller 1700 may be connected to the camera 1600 to estimate and control the posture of the camera 1600. The controller 1700 may include a fitting unit, a first controller, a second controller, and a third controller. The controller 1700 may adjust the yaw direction, the roll direction, and the pitch direction of the camera 1600, respectively. The yaw direction, the roll direction, and the pitch direction may be independently adjusted. The fitting unit, the first controller, the second controller, and the third controller that the controller 1700 includes will be described below in detail.

The inventive concept relates to a camera posture estimation method using a substrate used in a facility and is characterized by numerically displaying how much adjustment to the camera is required, by using a camera posture estimation method using a standardized size characteristic of a circular substrate and camera angle information reflected in facility design. In the case where a vision system is used to inspect a chamber, the result of the inspection varies depending on the posture of a camera sensor, and in order to make a system robust to an angle difference, a complex algorithm or a precision lighting system is required, or a method of lowering the accuracy of the inspection is required. However, because a simple inspection algorithm is required for rapid inspection, using the complex algorithm may cause a drop in production. For the precision lighting system, cost is inevitably increased, and lowering the accuracy of the inspection cannot be chosen because the accuracy of the inspection cannot be lowered below inspection margin. Therefore, it is the best way to accurately adjust the posture of a camera. However, due to a design tolerance, a part tolerance, and a manufacturing tolerance in a mass-production facility, it is not easy to accurately adjust the posture of the camera.

The inventive concept provides a method of estimating and displaying the current posture of a camera on a screen to inform a user how much adjustment is required, thereby enabling easy and accurate adjustment.

Figure 3:
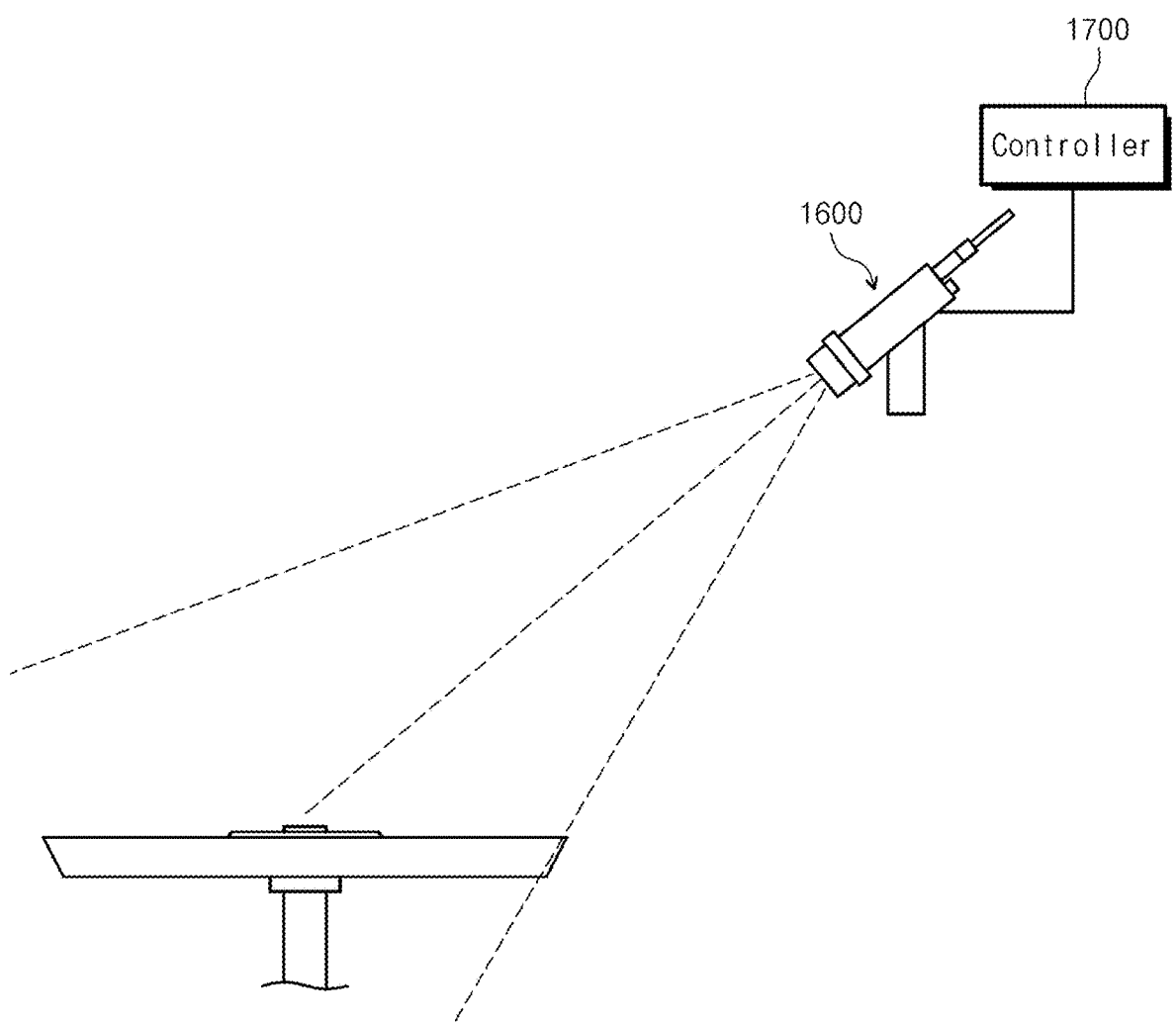
FIG. 3 is a schematic view illustrating the drawing of FIG. 2.

FIG. 3 is a schematic view illustrating the substrate processing apparatus 1000 of FIG. 2. FIG. 3 is a view illustrating only the substrate W to be photographed, the camera 1600, and the controller 1700 among the components of the substrate processing apparatus 1000 of FIG. 2. Referring to FIG. 3, the range of the photographing area of the camera 1600 may be identified. That is, it may be identified that the camera 1600 does not photograph only the substrate W, but photographs the background around the substrate W together.

Figure 4:
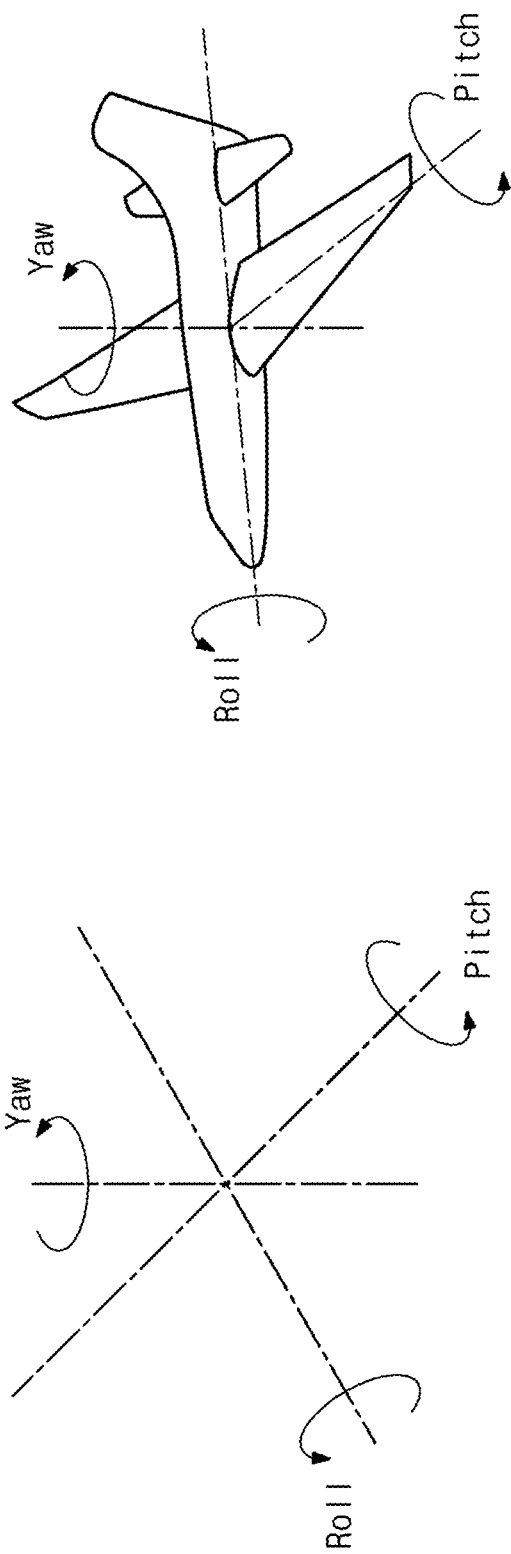
FIG. 4 is a view illustrating yaw, roll, and pitch.

FIG. 4 is a view illustrating the yaw, roll, and pitch directions of the camera 1600.

For ease of understanding, the following description will be given under the assumption that an object has an airplane form.

The yaw direction refers to a direction in which the corresponding object rotates about an axis perpendicular to the direction in which the object moves. Referring to the camera of FIG. 3, a movement in the yaw direction refers to a movement from side to side in a position where the camera 1600 views the substrate W.

The roll direction refers to a direction in which the body itself of the corresponding object rotates. Referring to the camera of FIG. 3, a movement in the roll direction refers to a twist of the body itself in a situation in which the camera 1600 views the substrate W. Specifically, it is considered that the body turns about its roll axis in the clockwise or counterclockwise direction in the situation in which the camera 1600 views the substrate W.

The pitch direction refers to a direction in which the object in an airplane form rotates about the axis of the wings. Referring to FIG. 4, it is considered that the body turns about its pitch axis in the clockwise or counterclockwise direction. Referring to the camera of FIG. 3, A movement in the pitch direction refers to an up and down movement in the situation in which the camera 1600 views the substrate W.

Based on the descriptions of the yaw, roll, and pitch directions, a method of estimating the posture of the camera 1600 in the inventive concept will be described below.

As described above, the controller 1700 of the substrate processing apparatus 1000 may include the first controller, the second controller, the third controller, and the fitting unit.

The fitting unit removes the background from an image of the substrate W that is taken with the camera 1600 and obtains an elliptical substrate image by performing ellipse fitting. The Gaussian mixture models (GMM) technique may be used to remove the background. After the removal of the background, the fitting unit may perform the ellipse fitting on the detected substrate by using a random sample consensus (RANSAC) technique. The fitting unit obtains the elliptical substrate image, on the basis of which the posture of the camera 1600 is estimated. Any techniques easily applicable in the region of those skilled in the art, in addition to the above-described techniques, may be applied to the background removal method and the ellipse fitting method.

The first controller of the substrate processing apparatus 1000 may control the yaw direction of the camera 1600. The conceptual principle of a method of adjusting the yaw direction is that the yaw direction is adjusted by using the difference between the center of an image taken with the camera 1600 and the center of the elliptical substrate image obtained by the fitting unit.

The first controller controls the yaw direction by using the pixel distance difference between the x-axis center of the ellipse obtained by performing the ellipse fitting by the fitting unit and the x-axis center of the image taken with the camera 1600. Referring to FIG. 5 (A), point B of FIG. 5 (A) refers to the center of the elliptical substrate image. Referring to FIG. 5 (B), point A refers to the center of the image taken with the camera 1600. That is, point A is the center of the image taken with the camera 1600, and point B is the center of the elliptical substrate image. Therefore, the yaw direction is adjusted by the x-axis difference between point A and point B. At this time, because the difference is a distance value between pixels, the yaw value may not be directly calculated, but how much the yaw angle of the camera 1600 moves may be indirectly estimated.

The first controller may control the yaw direction by using a back nozzle, in addition to the method of controlling the yaw direction by using the center of the elliptical substrate image. In general, a substrate processing apparatus may include a spin head on which a substrate is placed. The spin head is rotated by a rotational force generated by a driving motor. Accordingly, the substrate placed on the spin head is rotated. The back nozzle is provided on the spin head to dispense a chemical onto the backside of the substrate to etch the backside of the substrate. In the inventive concept, the yaw direction may be adjusted by finding out the shape of the back nozzle in an image of a chamber having no substrate and calculating the pixel distance difference between the center of the found shape and the center of the camera. At this time, a template matching technique may be used to detect the back nozzle in the image.

Figure 6:
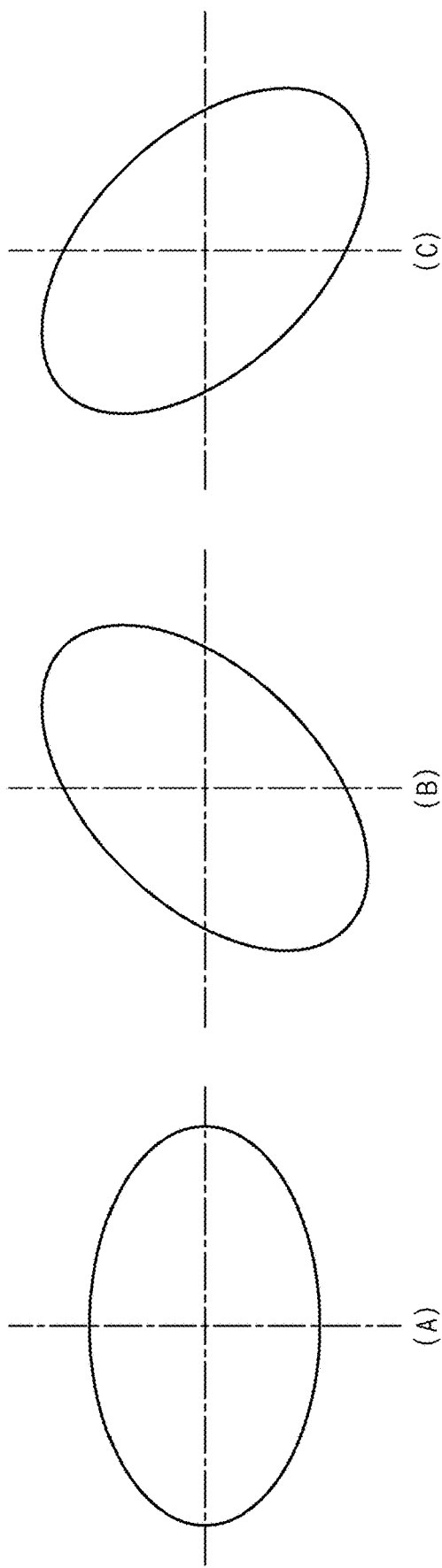
FIG. 6 is a view illustrating adjustment of a roll direction of a camera in the inventive concept.

Hereinafter, controlling the roll direction of the camera 1600 will be described with reference to FIG. 6. The second controller of the substrate processing apparatus 1000 may control the roll direction of the camera 1600. FIGS. 6 (A), (B), and (C) are views illustrating elliptical substrate images that vary according to rotation of the camera 1600 in the roll direction. Referring to FIG. 6 (A), FIG. 6 (A) illustrates a state in which the elliptical substrate image is not rotated in the roll direction. That is, in FIG. 6 (A), it is not necessary to adjust the posture of the camera 1600 in the roll direction. When determination is made with respect to the horizontal and vertical axes, it may be identified that there is no inclination. However, referring to FIG. 6 (B) and FIG. 6 (C), it may be identified that the ellipses are inclined when determination is made with respect to the horizontal and vertical axes.

That is, in the case where an elliptical substrate image obtained by performing ellipse fitting on an image taken with the camera 1600 is inclined to the left or right with respect to the horizontal and vertical axes, the second controller may adjust the roll direction in the opposite direction to the inclined direction to estimate and adjust the posture of the camera 1600 in the roll direction.

Specifically, after a substrate is normally placed on the substrate support unit, a substrate image is detected from an image taken with the camera, by using the background removal technique. Accordingly, the major axis, the minor axis, and the inclined angle of the elliptical substrate image may be estimated. Here, the actual substrate normally placed on the substrate support unit cannot be inclined because the actual substrate has a circular shape. The inclined angle of the elliptical substrate image means that the camera 1600 rotates in the roll direction, and therefore the inclined angle of the elliptical substrate image may be replaced with the roll angle of the camera 1600. Accordingly, the roll direction may be corrected by calculating the corresponding roll angle.

Hereinafter, controlling the pitch direction of the camera 1600 will be described with reference to FIG. 7. The third controller of the substrate processing apparatus 1000 may control the pitch direction of the camera 1600. FIGS. 7 (A), (B), (C), and (D) are views illustrating elliptical substrate images that vary according to a movement of the camera 1600 in the pitch direction. Referring to FIG. 7, it may be identified that there is a difference between the eccentricities of ellipses, that is, the degrees of distortion. The camera 1600, when rotating in the pitch direction, moves up and down with respect to the direction toward the substrate, and an ellipse may be represented by a circle or a line according to the pitch angle. That is, it may be identified through FIG. 7 that when the camera 1600 moves in the pitch direction, the form of an ellipse is changed from a circular form to a form with a varying eccentricity.

Specifically, because a normally placed actual substrate has a circular shape, when an elliptical substrate image is obtained, this means that the camera 1600 rotates in the pitch direction and thus one axis of the circle is reduced. If the camera 1600 takes an image in the perpendicular direction to the substrate, a circular substrate image is obtained, but with an increase in the angle between the substrate and the camera 1600, the circular substrate image is changed into an elliptical substrate image and finally a line image. This is a physical phenomenon due to perspective distortion, and because those skilled in the art already know that the substrate has a circular shape, even though the substrate image taken with the camera 1600 has an elliptical shape, the pitch angle may be obtained by a combination of the major axis and the minor axis of the ellipse. Assuming that the major axis of the ellipse is "a" and the minor axis is "b", the pitch angle of the camera 1600 is given by the following equation.

$$\text{Pitch} = \sin^{-1}\frac{b}{a}$$

The pitch posture of the camera may be estimated by compensating for the angle difference between the pitch angle and a reference design value.

The reference design value varies depending on the type of chamber. The reason for that is because a chamber size and a facility vary depending on the type of chamber and thus there is a difference in a set reference value.

As described above, the current posture of the camera may be estimated based on the three angles in the yaw, pitch, and roll directions and may be displayed on a display device to enable the camera position to be accurately and easily adjusted.

Figure 8:
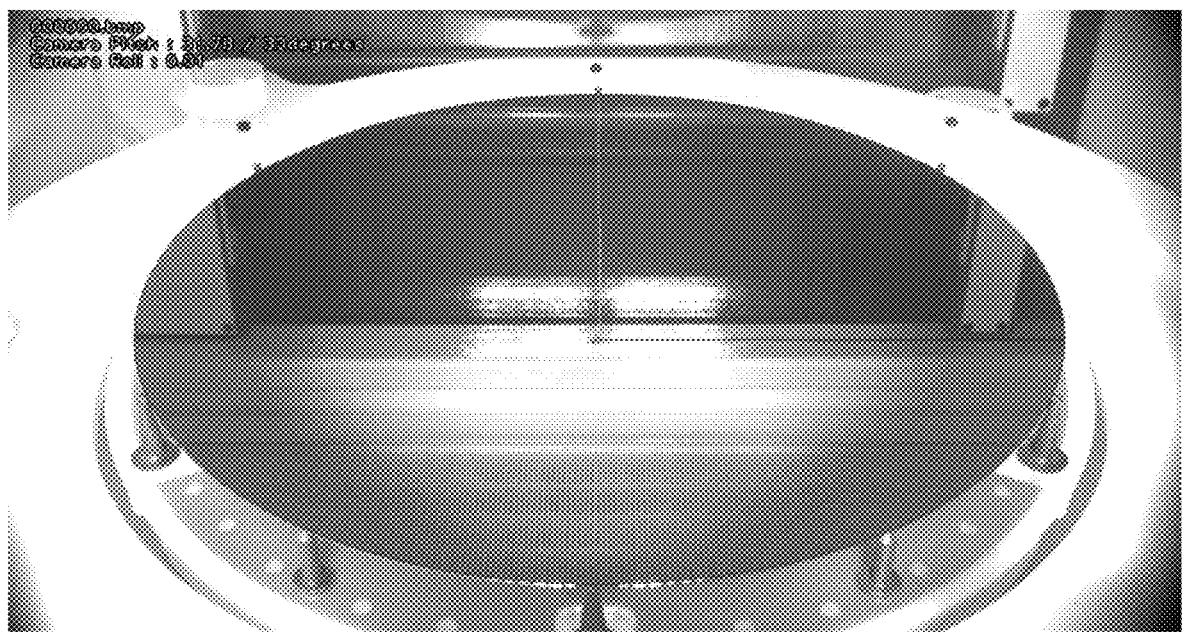
FIGS. 8 and 9 are views illustrating adjustment of a roll direction and a pitch direction of an actual camera in the inventive concept.
Figure 9:
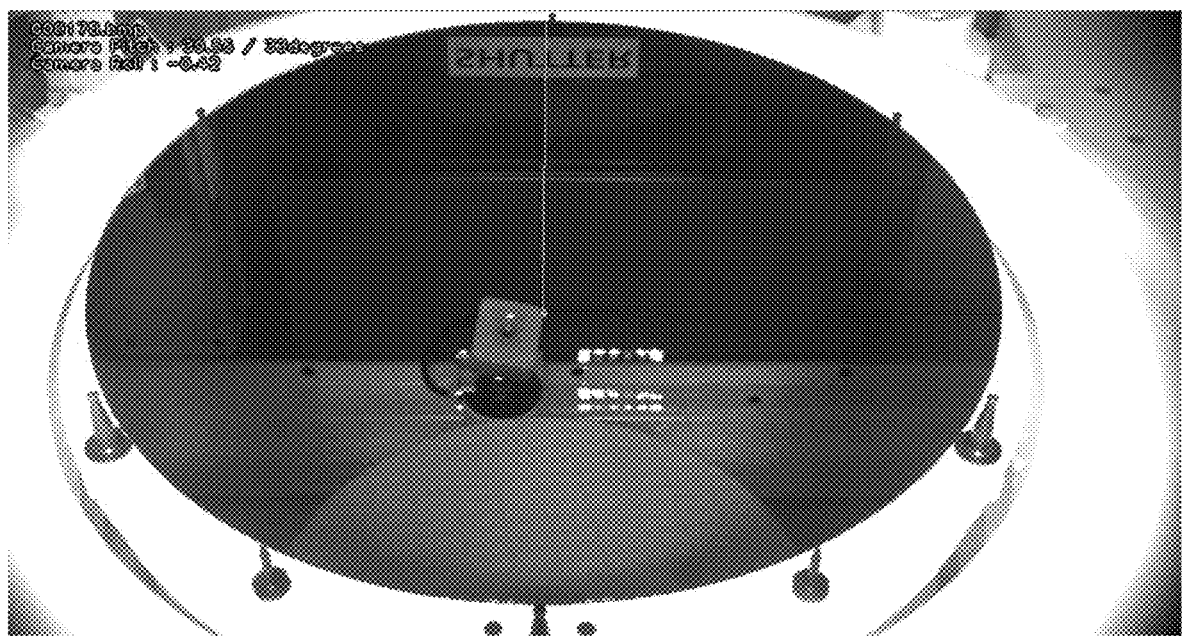

Hereinafter, a method of estimating the posture of an actual camera will be described with reference to FIGS. 8 and 9. FIGS. 8 and 9 are views illustrating a method of estimating the posture of a substrate by using an actual camera.

In the case of FIG. 8, it may be identified that "Camera Pitch: 31.78/33 degrees, Camera Roll: 0.01" is displayed on an upper left side. In the case of FIG. 9, it may be identified that "Camera Pitch: 39.55/33 degrees, Camera Roll: −0.42" is displayed on an upper left side. The meanings of the displayed values are as follows.

The number displayed at the front of Camera Pitch means a pitch angle calculated by using a fitted ellipse, and the number displayed at the rear of Camera Pitch means an angle that is the reference point of the pitch angle. That is, in FIG. 8, the pitch angle has to be compensated for by 1.22 degrees that corresponds to the difference between the pitch angle and the reference angle, and in FIG. 9, the pitch angle has to be compensated for by 6.55 degrees that corresponds to the difference between the pitch angle and the reference angle. Referring to FIGS. 8 and 9, it may be identified that the eccentricity difference of the fitted elliptical image is clearly revealed.

The camera roll values mean the degrees to which the camera 1600 rotates in the roll direction. In FIG. 8, the roll value is 0.01. Hence, it can be seen that the camera 1600 rotates very slightly. However, in FIG. 9, the roll value is −0.42. Hence, it can be seen that the camera 1600 is rotated slightly to the left with respect to x-axis and y-axis reference lines. It is possible to compensate for the roll direction by the corresponding roll value.

Consequently, the roll value indicates the ellipse slope of the substrate when the substrate is installed, the pitch value indicates the difference between a design value and the current angle of the substrate, and the yaw value indicates the difference between the center of the camera image and the x-axis central coordinate of the substrate. Accordingly, the camera posture may be adjusted.

The yaw, roll, and pitch directions respectively adjusted by the first to third controllers may not affect each other and may be independently controlled.

Figure 10:
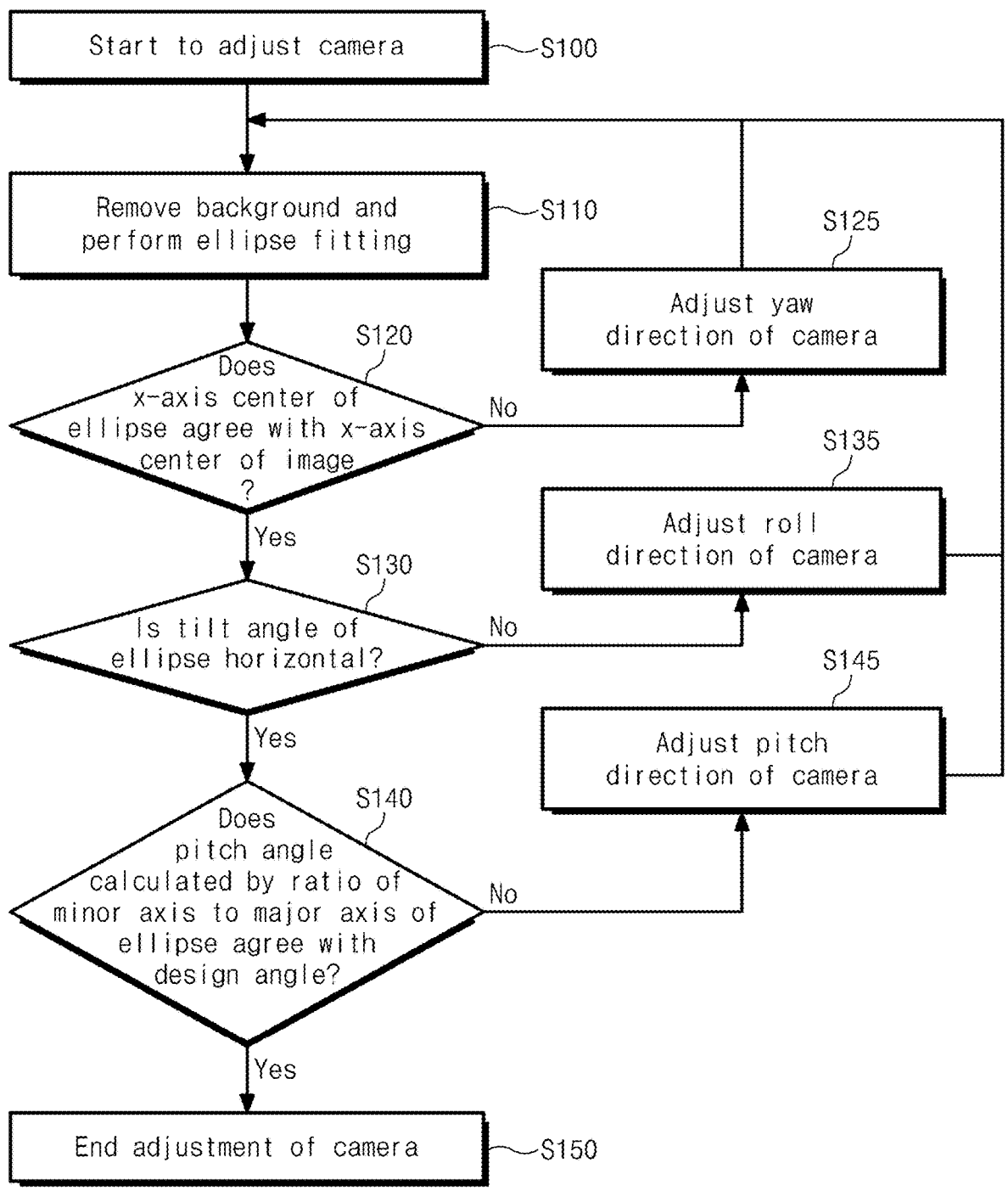
FIG. 10 is a flowchart illustrating a camera posture estimation method in the inventive concept.

Hereinafter, a camera posture estimation method in the inventive concept will be described with reference to FIG. 10.

The controller 1700 starts to adjust the camera 1600 installed in the substrate processing apparatus 1000 (S100). The controller 1700 removes the background other than a substrate from an image taken with the camera 1600 and performs ellipse fitting (S110). Based on the fitted ellipse, the controller 1700 extracts the X-axis center of the ellipse and the X-axis center of a camera image and determines whether the centers agree with each other (S120). When the centers agree with each other, the controller 1700 does not need to adjust the yaw direction. When the centers do not agree with each other, the controller 1700 adjusts the yaw direction by the difference between the centers (S125). In the next step, the controller 1700 determines whether the tilt angle of the fitted ellipse is horizontal (S130). When the tilt angle is horizontal, the controller 1700 does not need to adjust the roll direction, and when the tilt angle is not horizontal, the controller 1700 adjusts the roll direction by the tilt angle (S135). In the next step, the controller 1700 calculates the ratio of the minor axis to the major axis of the fitted ellipse and determines whether the pitch angle agrees with a design reference angle (S140). When the pitch angle agrees with the design reference angle, the controller 1700 does not need to adjust the pitch direction, and when the pitch angle differs from the design reference angle, the controller 1700 adjusts the pitch direction by the difference (S145). When all the processes for the three angles are completed, the controller 1700 ends the adjustment of the camera 1600 (S150). Although FIG. 10 illustrates one example that the posture of the camera is estimated in the order of the yaw direction, the roll direction, and the pitch direction, this is merely arbitrary order for convenience of operation, and actually the direction in which the posture of the camera is estimated first does not matter and does not affect the posture estimation.

The inventive concept provides a substrate processing apparatus including a camera capable of singly estimating a position without depending on a special jig, an external sensor, or learning data.

Furthermore, the inventive concept may estimate a posture in real time by using a camera that photographs a substrate at present.

Moreover, the inventive concept may easily and accurately estimate the posture of a camera.

In addition, the inventive concept may reduce set-up time and lower a difficulty level by using camera posture information displayed when a camera is set up in an actual facility, by reflecting a design tolerance, a part tolerance, and an assembly tolerance.

Effects of the inventive concept are not limited to the above-described effects. Any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for estimating a posture of a camera installed in a substrate processing apparatus to obliquely photograph an object, the method comprising:
    removing the remaining background other than a substrate and performing ellipse fitting;
    adjusting a yaw direction of the camera by using a difference between the center of a camera image and the center of an elliptical substrate image obtained by performing the ellipse fitting;
    adjusting a roll direction of the camera by using a tilt angle of an ellipse in the elliptical substrate image obtained by performing the ellipse fitting; and
    adjusting a pitch direction of the camera by using a ratio of a minor axis to a major axis of the ellipse in the elliptical substrate image obtained by performing the ellipse fitting.

2. The method of claim 1, wherein the adjusting of the yaw direction of the camera includes:
    identifying the center of the elliptical substrate image obtained by performing the ellipse fitting;
    calculating a distance difference between the center of the elliptical substrate image and a central pixel position of the camera image; and
    adjusting the yaw direction by the distance difference.

3. The method of claim 1, wherein the adjusting of the yaw direction of the camera includes:
    detecting a back nozzle installed in the center of a support unit configured to support the substrate, before performing the ellipse fitting;
    calculating a distance difference between a central pixel position of an image of the detected back nozzle and a central pixel position of the camera image; and
    adjusting the yaw direction by the distance difference.

4. The method of claim 1, wherein the adjusting of the roll direction of the camera includes:
    estimating a tilt angle of the elliptical substrate image obtained by performing the ellipse fitting; and
    adjusting the roll direction by the tilt angle.

5. The method of claim 1, wherein the adjusting of the pitch direction of the camera includes:
    measuring lengths of a major axis and a minor axis of the elliptical substrate image obtained by performing the ellipse fitting;
    calculating a pitch angle by using the measured lengths of the major and minor axes; and
    adjusting the pitch direction by a difference between a reference design angle and the calculated pitch angle.

6. The method of claim 1, wherein the adjusting of the roll direction, the pitch direction, or the yaw direction of the camera is independently performed.

7. An apparatus for processing a substrate, the apparatus comprising:
    a process chamber having a processing space inside;
    a support unit configured to support the substrate in the process chamber;
    a gas supply unit configured to supply a process gas into the processing space;
    a plasma source configured to generate plasma from the process gas;
    a camera installed in the apparatus to obliquely photograph the substrate; and
    a controller configured to adjust a posture of the camera in a yaw, roll, or pitch direction by using the substrate supported on the support unit,
    wherein the controller includes a fitting unit configured to remove the remaining background other than the substrate photographed and perform ellipse fitting.

8. The apparatus of claim 7, wherein the controller includes a first controller configured to adjust the yaw direction of the camera, and
    wherein the first controller:
        identifies the center of an elliptical substrate image obtained by performing the ellipse fitting by the fitting unit;
        calculates a distance difference between the center of the elliptical substrate image and a central pixel position of an image taken with the camera; and
        adjusts the yaw direction by the distance difference.

9. The apparatus of claim 7, wherein the controller includes a first controller configured to adjust the yaw direction of the camera, and
    wherein the first controller:

detects a back nozzle installed in the center of the support unit configured to support the substrate;

calculates a distance difference between a central pixel position of an image of the detected back nozzle and a central pixel position of an image taken with the camera; and adjusts the yaw direction by the distance difference.

10. The apparatus of claim 7, wherein the controller includes a second controller configured to adjust the roll direction of the camera, and wherein the second controller:

estimates a tilt angle of an elliptical substrate image obtained by performing the ellipse fitting by the fitting unit; and adjusts the roll direction by the tilt angle.

11. The apparatus of claim 7, wherein the controller includes a third controller configured to adjust the pitch direction of the camera, and wherein the third controller:

measures lengths of a major axis and a minor axis of an elliptical substrate image obtained by performing the ellipse fitting by the fitting unit;

calculates a pitch angle by using the measured lengths of the major and minor axes; and adjusts the pitch direction by a difference between a reference design angle and the calculated pitch angle.

12. The apparatus of claim 7, wherein the controller independently adjusts the roll direction, the pitch direction, or the yaw direction of the camera.

* * * * *